(12) United States Patent
Tsunoda et al.

(10) Patent No.: US 7,141,451 B2
(45) Date of Patent: Nov. 28, 2006

(54) WIRELESS COMMUNICATION MEDIUM AND METHOD OF MANUFACTURING THE SAME

(75) Inventors: Shigeharu Tsunoda, Fujisawa (JP); Naoya Kanda, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/959,082

(22) Filed: Oct. 7, 2004

(65) Prior Publication Data

US 2005/0085010 A1    Apr. 21, 2005

(30) Foreign Application Priority Data

Oct. 7, 2003    (JP)    ............... 2003-348806

(51) Int. Cl.
*H01L 21/44* (2006.01)
*H01L 21/48* (2006.01)
*H01L 21/50* (2006.01)

(52) U.S. Cl. ............... 438/113; 438/114; 438/115

(58) Field of Classification Search ............... 438/106, 438/113, 114, 115, 116, 117, 118, 464, 197; 29/829; 257/E21.514
See application file for complete search history.

(56) References Cited

U.S. PATENT DOCUMENTS

| | | | |
|---|---|---|---|
| 6,407,669 | B1 | 6/2002 | Brown et al. |
| 6,451,154 | B1 | 9/2002 | Grabau et al. |
| 6,942,156 | B1 | 9/2005 | Ohta |
| 2003/0062420 | A1 | 4/2003 | Ohta |
| 2005/0085010 | A1* | 4/2005 | Tsunoda et al. ............ 438/106 |
| 2005/0200539 | A1* | 9/2005 | Forster et al. ............. 235/492 |
| 2005/0206524 | A1* | 9/2005 | Forster et al. ............. 29/829 |

FOREIGN PATENT DOCUMENTS

| | | |
|---|---|---|
| DE | 19962194 | 6/2001 |
| EP | 1143378 | 10/2001 |
| JP | 2000-163551 | 6/2000 |
| JP | 2001-043341 | 2/2001 |
| JP | 2001-209778 | 8/2001 |
| JP | 2002-157561 | 5/2002 |
| JP | 2002-170087 | 6/2002 |
| JP | 2002-187223 | 7/2002 |
| JP | 2002-189999 | 7/2002 |
| JP | 2003-67696 | 3/2003 |
| WO | 01/61646 | 8/2001 |

* cited by examiner

*Primary Examiner*—Walter L. Lindsay, Jr.
(74) *Attorney, Agent, or Firm*—Antonelli, Terry, Stout and Kraus, LLP.

(57) ABSTRACT

A highly reliable inexpensive RFID medium (Radio-frequency Identification medium) and a method of manufacturing the same is provided, particularly for small, thin RFID mediums.

A RFID medium includes a transmitting/receiving antenna 2 and an IC chip 3. A rectangular part of a base sheet 1, having a major surface on which transmitting/receiving antennas 2 are formed, is folded along one of the long sides thereof, and the other three sides are bonded to the base sheet 1 so as to cover the transmitting/receiving antenna 2 and the IC chip 3 connected to the transmitting/receiving antenna 2. The base sheet 1 has spacing parts of a predetermined shape for covering the transmitting/receiving antenna 2 and the IC chip 3 connected to the transmitting/receiving antenna 2. The transmitting/receiving antennas 2 and the spacing parts 22 are arranged alternately. The base sheet 1 is rolled in a roll.

10 Claims, 13 Drawing Sheets

(a)

1: Base material
2: antenna
3: IC chip (b)

(a)

(b)

US 7,141,451 B2

WIRELESS COMMUNICATION MEDIUM AND METHOD OF MANUFACTURING THE SAME

CROSS-REFERENCE TO RELATED APPLICATIONS

The disclosure of Japanese Patent Application No. JP2003-348806, filed on Oct. 7, 2003, including the specification, drawings and abstract thereof, is incorporated herein by reference in its entirety.

BACKGROUND OF THE INVENTION

The present invention relates to a wireless communication medium for use in wireless communication, more specifically, a radio-frequency identification medium (RFID medium) generally called an IC tag. More particularly, the present invention relates to techniques effectively applicable to a RFID medium that is intended for use in combination with a thin or flexible structure, and to a method of manufacture of such a RFID medium.

The inventors of the present invention have found through studies that a RFID medium facilitates commodity management for inventory and commodity distribution, and authentication of commodities. The RFID medium has become prevalently used in combination with commodities for its inherent advantages. The RFID medium includes an IC chip for data processing and storage, and an antenna for signal transmission and reception. The RFID medium is shaped according to its intended usages in the form of a card or a sheet.

Usually a method of manufacturing a RFID medium uses a hot-pressing method or a lamination method. FIGS. 16(a) and 16(b) are sectional views of a RFID medium being formed by a general hot-pressing method. As shown in FIG. 16(a), a module 102, which is formed by joining an IC chip 100 and an antenna 101, is held between a base sheet 103 and a covering sheet 104 to form a structure. The structure is placed on a press 105, and the structure is compressed between a heated upper plate 106 and a heated lower plate 107 to form a semifinished RFID medium by bonding the base sheet 103 and the covering sheet 104 together. Then, the semifinished RFID, medium is shaped to obtain a RFID medium as shown in FIG. 16(b).

There are many lamination methods, including those disclosed in the below-listed Patent Documents 1 and 2.

A lamination method mentioned in Patent Document 1 will be described with reference to FIGS. 17 to 20. FIG. 17 shows an arrangement of component parts; FIG. 18 is a view illustrating a process of forming recesses in a base sheet; FIG. 19 shows an assembly of the base sheet and a cover sheet placed on the base sheet; and FIG. 20 is a sectional view of a finished, individual product.

As shown in FIG. 17, the lamination method mentioned in Patent document 1 forms hollows 113 in a base sheet 110; places modules 102, each formed by combining an IC chip 100 and an antenna 101, in the hollows 113; and laminates a covering sheet 104 to the base sheet 110 to protect the modules 102.

The hollows 113 are formed in the base sheet 110 by passing the base sheet 110 between two rotating rollers 111 and 112, as shown in FIG. 18. The roller 111 has an embossed circumference with a shape complementary to the shape of the hollow 113. The rollers 111 and 112 are heated to a temperature substantially equal to the softening point of the base sheet 110, so that the hollows 113 may be easily formed.

After the modules 102 have been placed in the hollows 113 of the base sheet 110, the covering sheet 104 is laminated to the base sheet by a hot-pressing method, a lamination method or an ultrasonic bonding method to form a laminated sheet having the modules 102, as shown in FIG. 19. The laminated sheet is cut into individual finished products, each including one module 102, as shown in FIG. 20.

A method mentioned in Patent Document 2 will be described with reference to FIGS. 21 to 23. FIG. 21 is a diagram illustrating a method of manufacturing an IC-inlaid band and an IC tag; FIG. 22 is a sectional view showing separate IC tag bodies; and FIG. 23 is a sectional view of IC tags formed by attaching labels to the IC tag bodies, respectively.

Referring to FIG. 21, which illustrates the method of manufacturing an IC-inlaid band and an IC tag, an IC-inlaid band a is wound around a roller A, a release sheet b is wound around a roller B, and a combined sheet formed by attaching the IC-inlaid band to the release sheet b is taken up on a roller C. The IC-inlaid band a unwound from the roller A is bonded to the release sheet b by rollers 201 and 202 to form the combined sheet, and the combined sheet is taken up on the roller C. An adhesive 204 is applied to the release sheet b using an application roller 200 before the release sheet b is bonded to the IC-inlaid band a. The combined sheet is cut with a cutting blade 203, which is disposed between the rollers 201, 202 and the roller C, such that the release sheet b is not cut and IC-inlaid parts are separated. An unnecessary part is taken up on a roller D.

In a state after the combined sheet has been thus cut, a release sheet 205 consists of a base sheet and a silicone resin layer 210, and IC inlays 208, each consisting of an IC chip 207 and an antenna, not shown, are separately arranged on the release sheet 205 with gaps 209 formed between the adjacent IC inlays 208, as shown in FIG. 22. Then, labels 211 are attached to the IC inlays 208, as shown in FIG. 23. The roller C is used in a process similar to that shown in FIG. 21 to increase the width of the gaps 209 on the release sheet according to the size of the labels 211.

[Patent Document 1] Japanese Patent Laid-open No. 2003-67696

[Patent Document 2] Japanese Patent Laid-open No. 2002-187223

SUMMARY OF THE INVENTION

The inventors of the present invention have examined the techniques relating to production of the foregoing RFID mediums. The hot-pressing method shown in FIG. 16 produces the RFID mediums one at a time, and there is difficulty in reducing the manufacturing cost. When the hot-pressing method is applied to the manufacture of small, thin products, such as IC tags, a plurality of structures formed by combining component parts are arranged between the upper and the lower plate and are hot-pressed simultaneously. However, it is possible that different pressures will be applied to the different structures, adversely influencing the reliability of the products. A process for separating the individual products will increase the manufacturing cost.

The lamination method illustrated by FIG. 17 needs the specially prepared roller 111 for forming the hollows 113 having a shape complementary to that of the module 102 in the base sheet 110, which will increase the manufacturing cost. The process of placing the modules 102 in the hollows 113 also increases the manufacturing cost. The protective covering sheet 104 will increase the material cost. Since the rollers need to be heated to heat the base sheet to its softening point in forming the hollows 113, the base sheet must be formed of a thermoplastic resin, and the base sheet formed of a resin having a high softening point is difficult to process. Thus, it is possible that the material of the base sheet places restrictions on a user's using condition.

In the method illustrated by FIG. 21, separate IC inlays 208 are arranged at small intervals on and are bonded with the adhesive 204 to the release sheet 205. This combination of the base sheet 205 and the IC inlays is processed by several processes to complete the IC tag shown in FIG. 23. The capability of forming IC tags of an optional size by gradually increasing the width of the gaps 209 by several steps is the advantage of this method.

However, this method needs complicated manufacturing processes that increase the manufacturing cost. Moreover, it is possible that a large amount of materials is wasted by the many manufacturing processes, the material efficiency is low, and the members are costly.

Accordingly, it is an object of the present invention to solve the foregoing problems, to provide a highly reliable inexpensive RFID medium and to provide a method of manufacturing the same. The present invention is intended particularly to provide a small, thin RFID medium.

To achieve the above-stated object, the present invention is applied to a RFID medium including a transmitting/receiving antenna and an IC chip connected to the transmitting/receiving antenna, and it is characterized in that part of a base sheet having a major surface on which the transmitting/receiving antenna is formed is folded and the folded part of the base sheet is bonded to the base sheet so as to cover the IC chip connected to the transmitting/receiving antenna. The base sheet is characterized by having alternately arranged spacing parts for covering the transmitting/receiving antennas and the IC chips and being rolled in a roll.

A method of manufacturing a RFID medium according to the present invention is characterized by including the steps of: connecting an IC chip to a predetermined part of a transmitting/receiving antenna after forming a spacing part for covering the transmitting/receiving antenna and the IC chip; filling an underfill material in a gap between the transmitting/receiving antenna and the IC chip and curing the under fill material, if necessary; testing an assembly of the transmitting/receiving antenna and the IC chip for communicating performance to decide if the assembly is acceptable; applying an adhesive to the transmitting/receiving antenna and forming slits in a predetermined shape in the spacing part between transmitting/receiving antennas to form a cut part; forming a folded part by folding the cut part demarcated by the slits formed in the spacing part of the base sheet to form a folded part; pressing the folded part for shaping with a roller; and taking up the shaped, folded part on a take-up roller.

In the RFID medium of the present invention, the transmitting/receiving antenna and the IC chip can be covered without using any additional member, and, hence, the RFID medium can be manufactured at a low manufacturing cost. Since the transmitting/receiving antenna and the IC chip are covered with the spacing part, the transmitting/receiving antenna and the IC chip can be tested for acceptance tests on the base sheet, and, hence, the RFID medium can be efficiently manufactured.

BRIEF DESCRIPTION OF THE DRAWINGS

FIGS. 16(a) and 16(b) are schematic sectional views illustrating a general hot-pressing method, in which FIG. 16(a) is a sectional view of a workpiece during a pressing operation, and FIG. 16(b) is a sectional view of a RFID medium finished by the pressing operation.

DETAILED DESCRIPTION OF THE INVENTION

Figure 1:
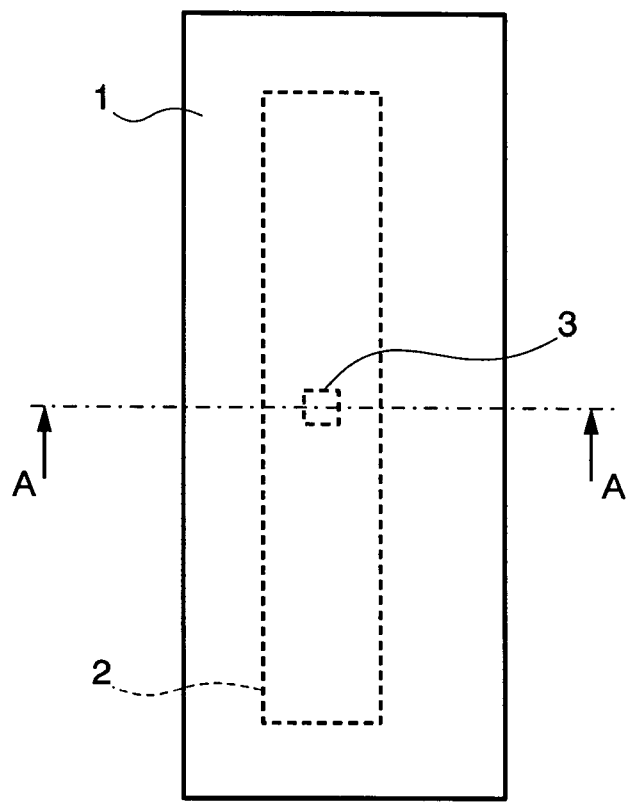
FIG. 1(a) is a plan view of a RFID medium representing a preferred embodiment according to the present invention.
FIG. 1(b) is a sectional view taken on line A—A in FIG. 1(a).
Figure 1:
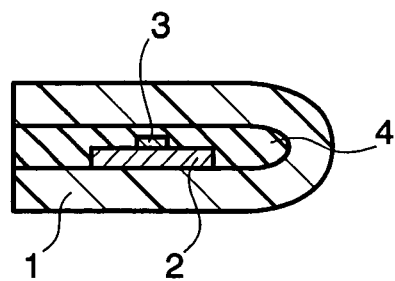

Preferred embodiments according to the present invention will be described with reference to the accompanying drawings, in which members having the same functions are designated as a rule by the same reference characters, and a repetitive description thereof will be omitted.

A RFID medium in a preferred embodiment according to the present invention is selected to have a rectangular shape as seen in plan view. However, the RFID medium according to the present invention also may have a semicircular shape, a substantially semicircular shape or a substantially square shape, provided that the RFID medium can be formed by folding and bonding a base sheet. Since it is preferable that an antenna included in the RFID medium has a rectangular shape from the viewpoint of processing, it is preferable that the RFID medium has a rectangular shape.

The construction of a RFID medium representing a preferred embodiment according to the present invention will be described with reference to FIG. 1(*a*) and FIG. 1(*b*).

The RFID medium in this embodiment, having a rectangular shape as seen in plan view, has a base sheet 1, a transmitting/receiving antenna 2 formed on the base sheet 1, and an IC chip 3 electrically connected to a predetermined part of the transmitting/receiving antenna 2. The base sheet 1 is folded in two parts so as to cover the transmitting/receiving antenna 2 and the IC chip 3. The RFID medium 1 has three sides formed by bonding the respective three sides of the two parts of the folded base sheet 1 with an adhesive 4 or such. A gap, not shown, in the joint of the transmitting/receiving antenna 2 and the IC chip 3 may be filled with an underfill material, such as an epoxy resin, to protect the joint.

Suitable soft materials for forming the base sheet 1 include polyimide resin films, polyethylene terephthalate resin films, polyphenylene sulfide resin films, polyethylene naphthalate resin films, polyether-sulfone resin films and polyether imide resin films. Metal films suitable for forming the transmitting/receiving antenna 2 include Cu—Sn films and Al films. The thickness of the base sheet 1 is in the range of 0.01 to 0.1 mm. Materials suitable as the adhesive 4 include acrylic adhesives, epoxy adhesives, silicone adhesives and polyimide adhesives. Naturally, the foregoing resins endowed with flexibility may be used. The IC chip 3 is in the range of about 0.1 to 0.4 mm sq. The thickness of the IC chip 3 is in the range of 0.02 to 0.5 mm. Those dimensions of the IC chip 3 are not limitative and restrictive.

Figure 2:
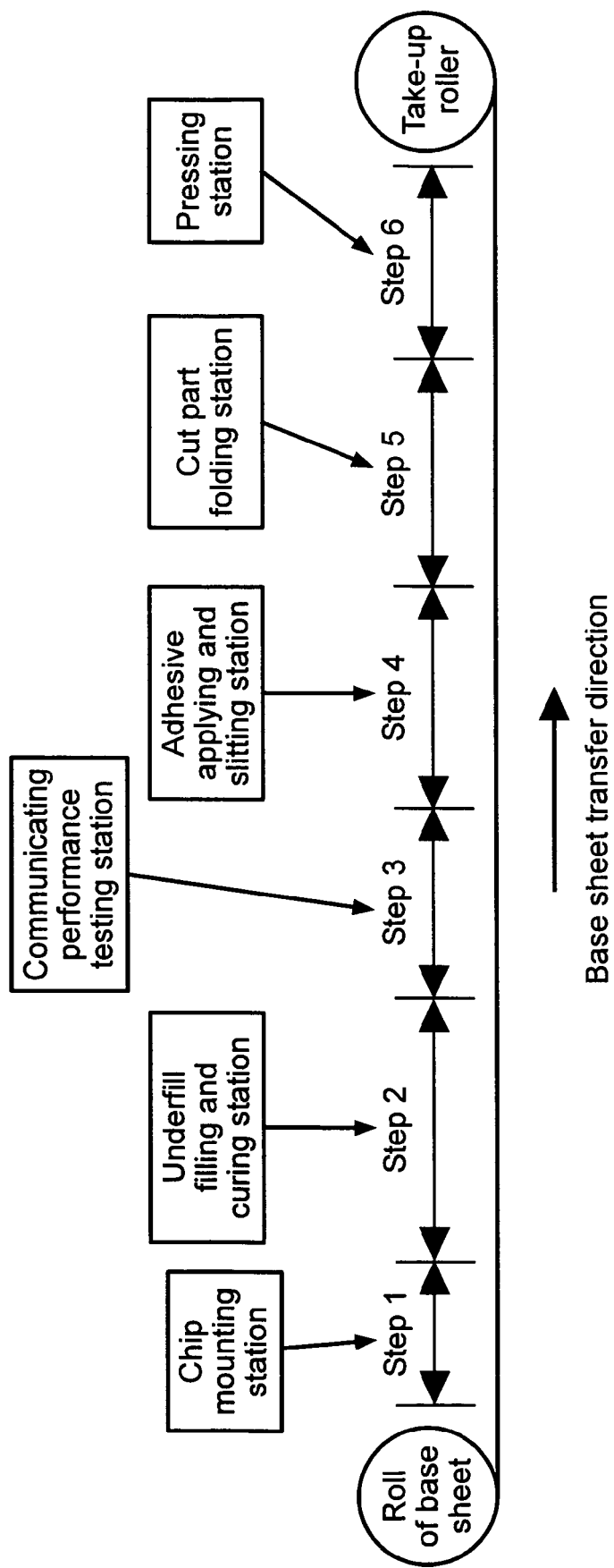
FIG. 2 is a diagrammatic view illustrating steps of a RFID medium manufacturing method representing a preferred embodiment according to the present invention.

A RFID medium manufacturing method representing a preferred embodiment according to the present invention will be described with reference to FIG. 2, which illustrates the successive steps of the RFID medium manufacturing method by way of example.

A description will be made by way of example in which a base sheet on which transmitting/receiving antennas are formed is wound in a base sheet roll, and the base sheet is unwound from the base sheet roll and is rolled in a product roll. It's the manufacturing processes therebetween are as described below.

An IC chip is mounted on and bonded to a predetermined part of the transmitting/receiving antenna formed on the base sheet that is unwound from the base sheet roll at a chip mounting station (Step 1). An underfill material is filled in a gap between the transmitting/receiving antenna and the IC chip, and the underfill material is cured under predetermined conditions to form an assembly of the transmitting/receiving antenna and the IC chip at an underfill filling and curing station (Step 2). The assembly is then transferred to a communicating performance testing station where the communication performance of the assembly is tested. If the assembly is defective, a rejection mark is put on the assembly or the IC chip is removed from the assembly. Thus, assemblies are sorted according to their qualities (Step 3).

Subsequently, a proper amount of an adhesive is applied to the transmitting/receiving antenna and the IC chip of the assembly, and three slits are formed in a rectangular spacing part between the adjacent IC chips (a long slit and two slits at the opposite ends of the long slit) at an adhesive-applying and slitting station (Step 4). The cut part demarcated by the slits is folded so as to cover the transmitting/receiving antenna and the IC chip to form a semifinished RFID medium at a cut part folding station (Step 5). A folded part of the semifinished RFID medium is pressed with a pressing roller before shaping to finish a RFID medium at a pressing station (Step 6). The finished RFID medium is taken up on a take-up roller.

It goes without saying that the above-described series of steps does not need to be performed in the foregoing sequence; that is, the steps may be performed in separate manufacturing lines. The underfill filling and curing station and the chip mounting station may be interchanged. For example, an anisotropic conductive adhesive having a function similar to that of the underfill material may be used. The inspecting step may be performed at any stage after the IC chip has been mounted on and bonded to the base sheet. The underfill material may be omitted if the condition of a working environment permits. The IC chip can be satisfactorily bonded to the base sheet by an ultrasonic bonding method, or a metallic bonding method using hot pressing may be employed. Any suitable bonding method may be used.

The steps of the RFID medium manufacturing method will be described with reference to FIGS. 3(*a*) to 14.

The chip mounting station will be described with reference to FIG. 3(*a*) and FIG. 3(*b*).

Figure 3:
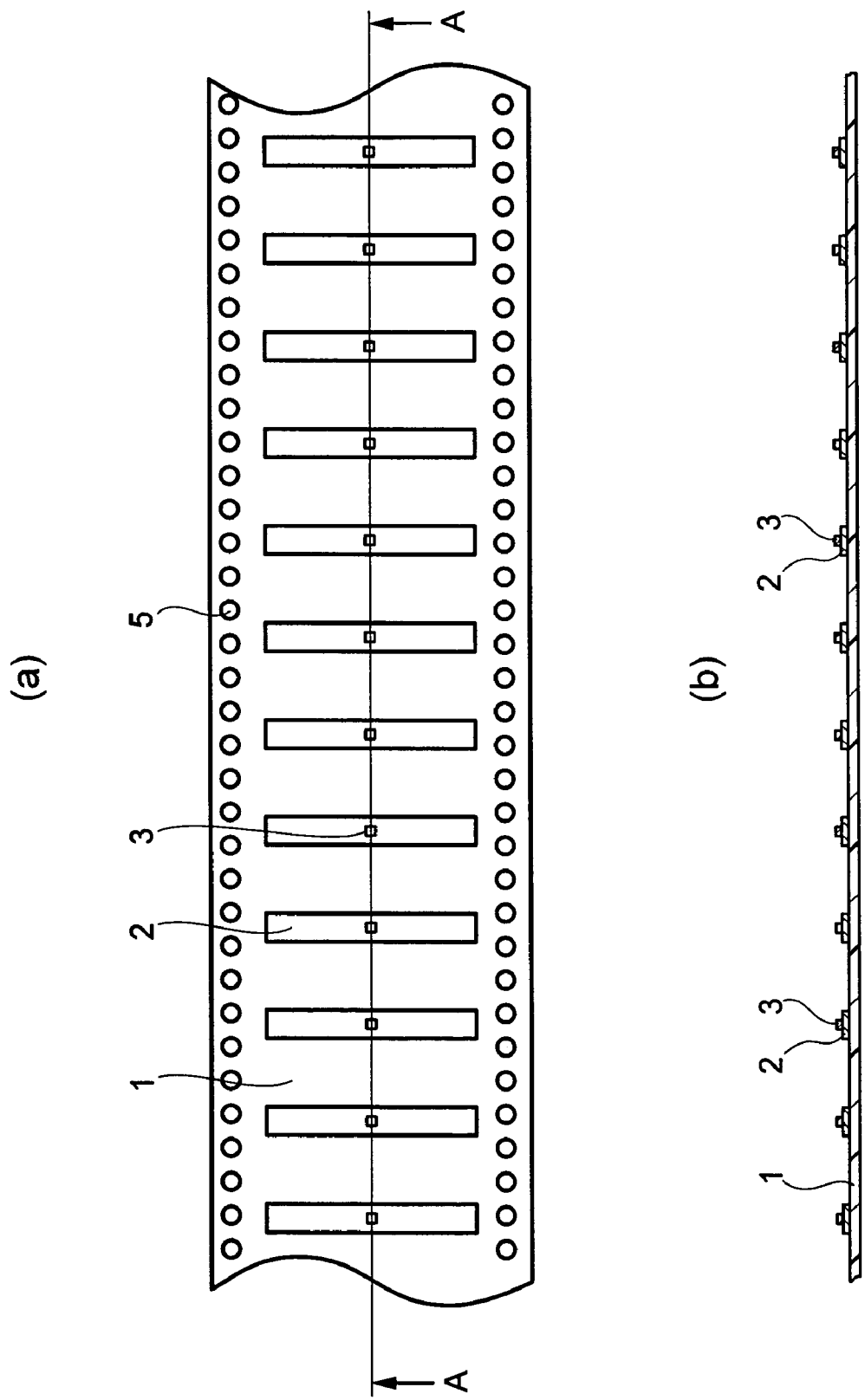
FIG. 3(a) is a plan view of IC chips mounted on the base sheet in the RFID medium manufacturing method representing the preferred embodiment of the present invention.
FIG. 3(b) is a sectional view taken on line A—A in FIG. 3(a).

Referring to FIGS. 3(*a*) and 3(*b*), transmitting/receiving antennas 2 are formed on a base sheet 1. IC chips 3 are attached to predetermined parts of the transmitting/receiving antennas, respectively. The transmitting/receiving antennas 2 are formed by etching a metal foil attached to the base sheet 1 and entirely covering one of the major surfaces of the base sheet 1. Sprocket holes 5 are formed along the opposite longitudinal sides of the base sheet 1. The sprocket holes 5 are used to transfer the base sheet from one to another station.

The underfill filling and curing station will be described with reference to FIG. 4(a), which is a sectional view of an assembly of the transmitting/receiving antenna and the IC chip at the start of an underfill filling and curing operation, and FIG. 4(b), which is a sectional view of the assembly at the completion of the underfill filling and curing operation.

Figure 4:
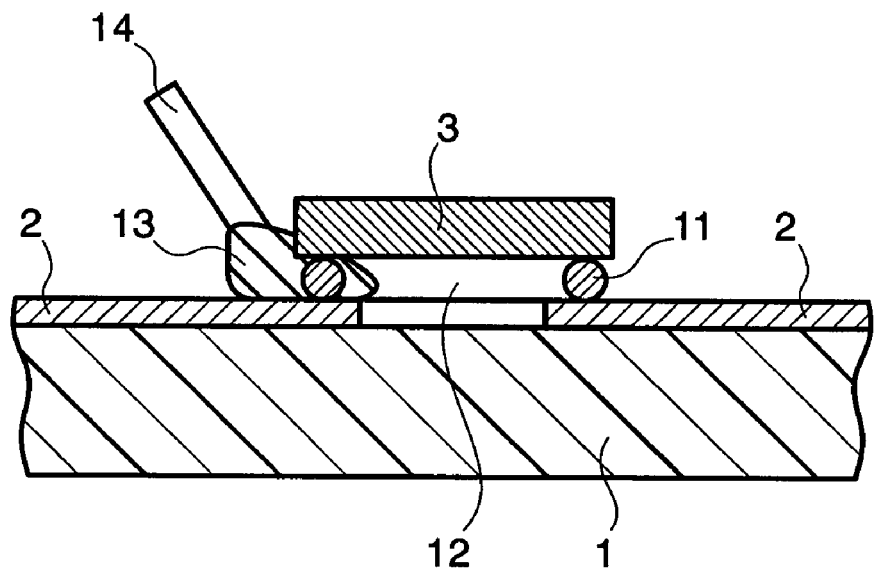
FIG. 4(a) is a sectional view showing the start of an underfill filling and curing operation in the RFID medium manufacturing method according to the preferred embodiment of the present invention.
FIG. 4(b) is a sectional view showing the completion of the underfill filling and curing operation.
Figure 4:
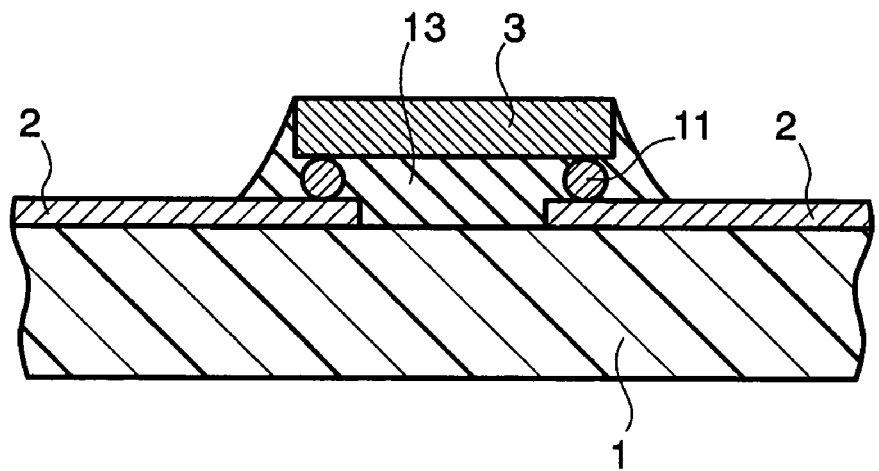

Referring to FIG. 4(a), at the start of the underfill filling and curing operation, an underfill material 13 is filled in a gap 12 between the transmitting/receiving antenna 2 and the IC chip 3, which is bonded to the transmitting/receiving antenna 2 with bumps 11. A needle 14 extending from a dispenser, not shown, is moved to a position near one side of the IC chip 3, and a proper amount of an underfill material 13 is dropped. This provides a state of complete filling of the underfill material, as shown in FIG. 4(b). Then, the underfill material 13 is cured under predetermined curing conditions, and then the assembly is transferred to the following inspecting step.

Figure 5:
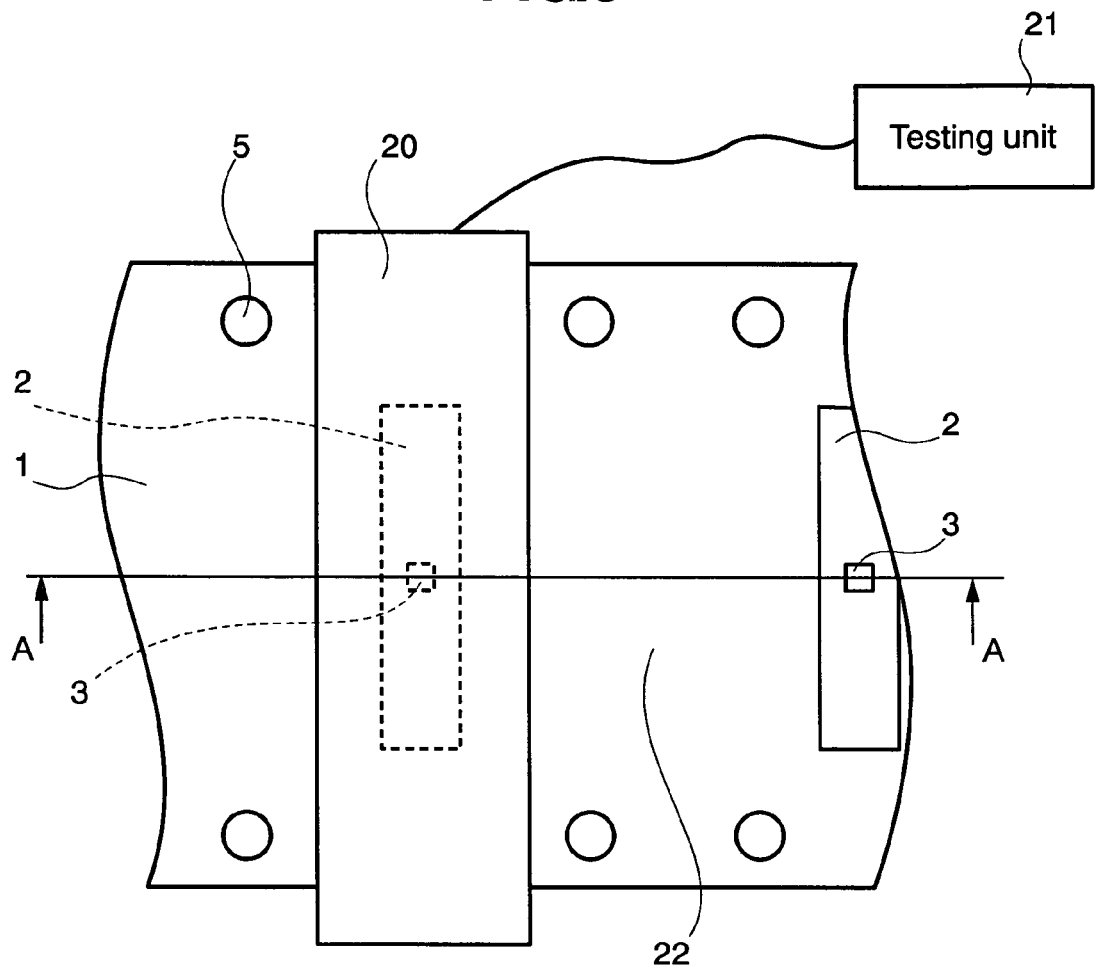
FIG. 5 is a typical plan view of a testing device for carrying out a communicating performance testing step included in the RFID medium manufacturing method according to the preferred embodiment of the present invention.

The communicating performance testing station will be described with reference to FIGS. 5 and 6. FIG. 5 is a typical plan view showing the communicating performance testing step, and FIG. 6 is a sectional view taken on line A—A in FIG. 5.

Referring to FIG. 5, the testing device for carrying out the communicating performance testing step includes, as basic components, an antenna 20 capable of exchanging data with the transmitting/receiving antenna 2 that is connected to the IC chip 3, and a testing unit 21 for processing data sent out and received to determine the quality of the communicating performance.

Figure 6:
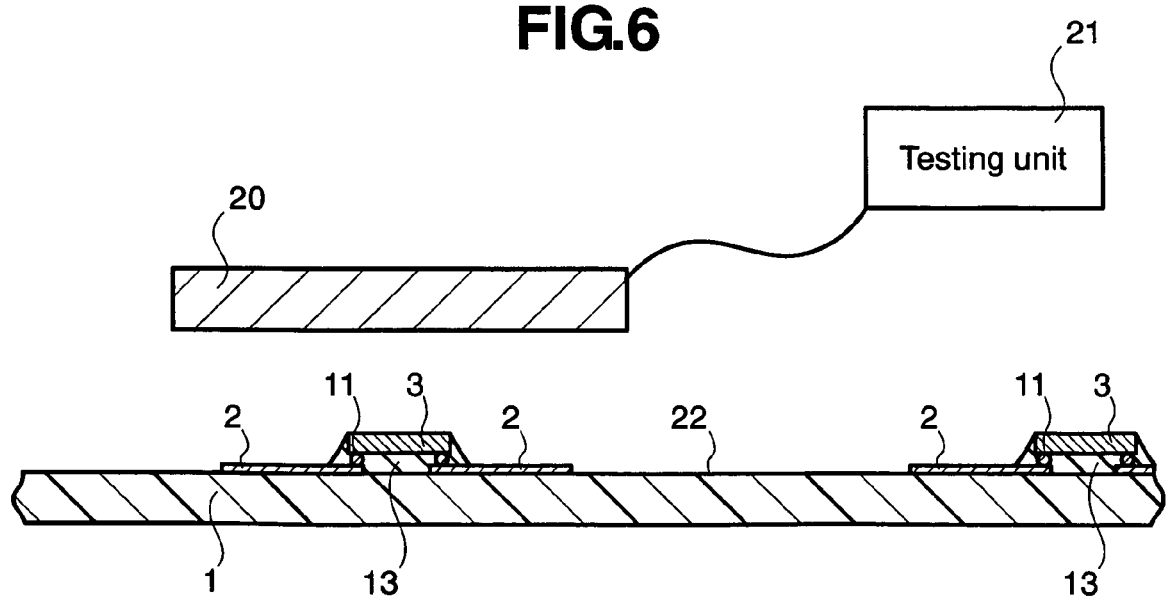
FIG. 6 is a sectional view taken on line A—A in FIG. 5 in the RFID medium manufacturing method according to the preferred embodiment of the present invention.

Referring to FIG. 6, the antenna 20 is held at a fixed distance from the transmitting/receiving antenna 2 connected to the IC chip 3. Then, the testing unit 21 transmits a radio wave of a specific frequency through the antenna 20 to the transmitting/receiving antenna 2 connected to the IC chip 3. An electric circuit included in the IC chip 3 converts the energy of the radio wave into driving power for driving the IC chip 3. At the same time, the testing unit 21 sends a signal to make the IC chip 3 send out signals representing data stored therein to the IC chip 3. Then, the IC chip sends the signals through the transmitting/receiving antenna 2 to the testing device.

The testing unit 21 processes and examines the data represented by the received signals to determine the quality of the IC chip 3. The IC chips 3 are tested by an individual-testing method that tests the IC chips 3 individually or by a simultaneous-testing method that tests the plurality of IC chips simultaneously. When the IC chips 3 are tested simultaneously by the simultaneous-testing method, the respective qualities of the plurality of IC chips 3 must be individually determined, which takes a long time. It is desirable to complete testing of the IC chips in a short time for improvement of the productivity, and the IC chips 3 need to be individually tested.

The antenna 20 needs to have an appropriate area to receive the signals representing the data from the IC chip 3 and to give driving energy to the IC chip 3. If a plurality of IC chips 3 lie in a region corresponding to the area of the antenna 20, signals sent out by the IC chips 3 interfere with each other, normal data exchange cannot be successfully achieved and it is possible that the testing unit 21 will make a wrong decision. Therefore, transmitting/receiving antennas 2 must be arranged on the base sheet 11 such that the adjacent transmitting/receiving antennas are spaced by a spacing part 22 having a length that prevents interference between the signals. It is a feature of the present invention to utilize the spacing part 22. The feature of the present invention will be described with reference to FIG. 7 and the following drawings.

Figure 7:
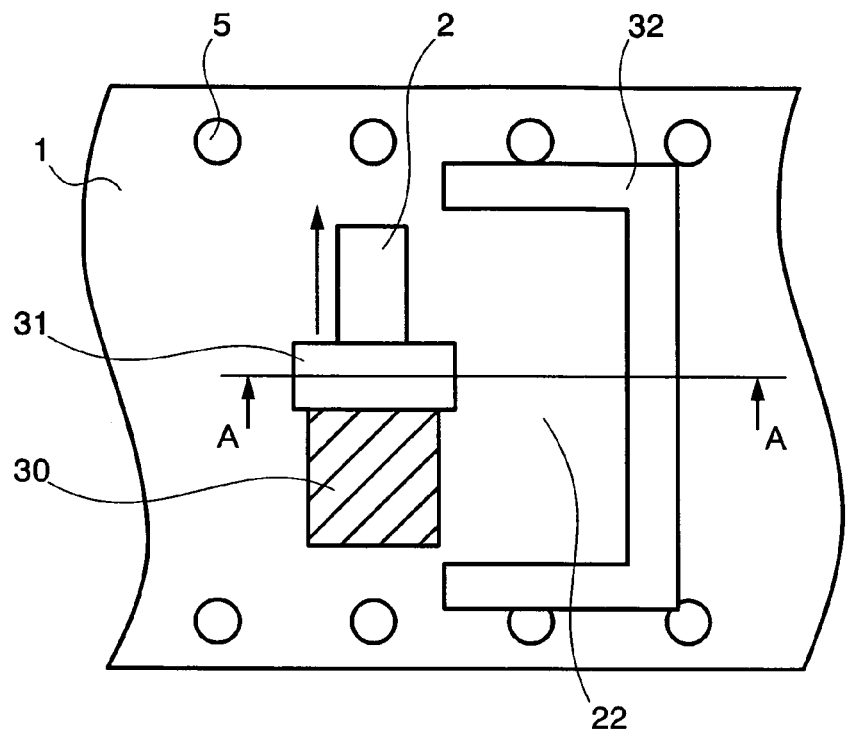
FIG. 7 is a typical plan view of an adhesive applying and slitting station in the RFID medium manufacturing method according to the preferred embodiment of the present invention.

The adhesive applying and slitting station will be described with reference to FIGS. 7 and 8. FIG. 7 is a typical plan view of the adhesive applying and slitting station, and FIG. 8 is a sectional view taken on line A—A in FIG. 7.

Referring to FIG. 7, a syringe, not shown, containing an adhesive 30 is connected to a resin-filling device, not shown. The resin-filling device applies pressure to the adhesive 30 contained in the syringe to force the adhesive 30 through a nozzle 31. The nozzle 31 is moved over the transmitting/receiving antenna 2 such that the transmitting/receiving antenna 2 is covered entirely with an adhesive film of the adhesive 30 to a predetermined thickness, and then it is moved to a predetermined position outside the base sheet 1. Then, the spacing part 22 is slit by the slitting step. The spacing part 22 is slit with a slitting blade 32 included in a slitting device, not shown, to form a cut part.

Figure 8:
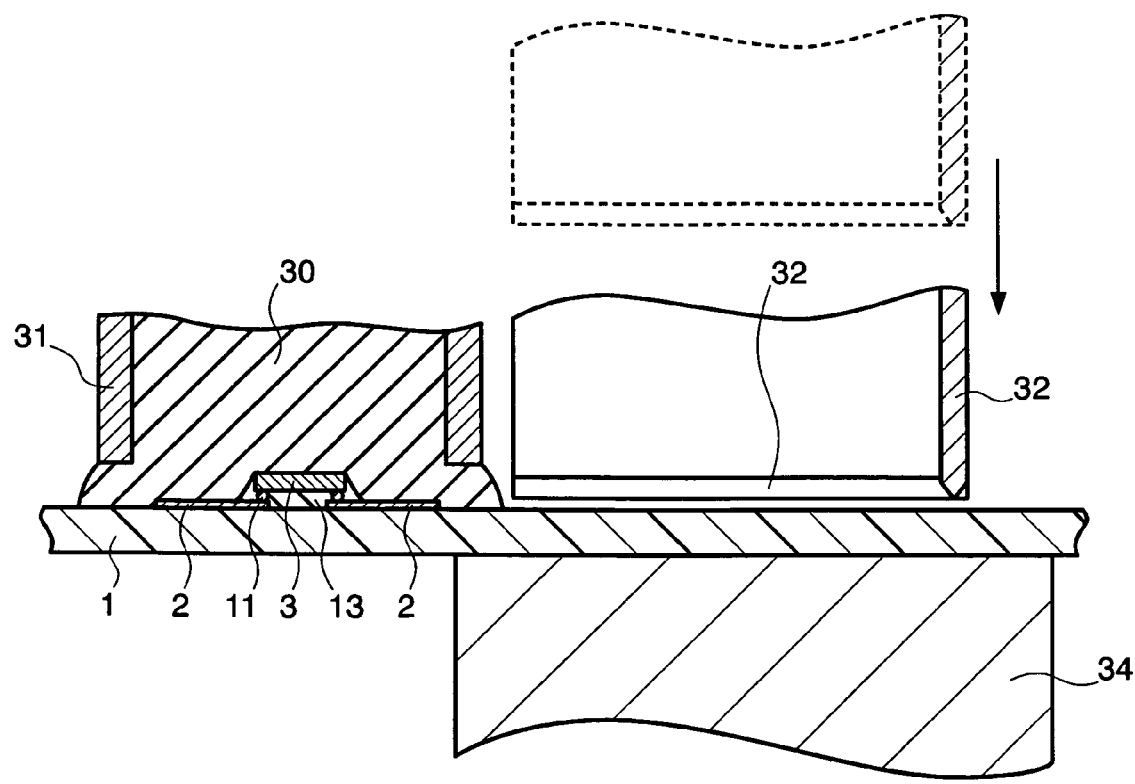
FIG. 8 is a sectional view taken on line A—A in FIG. 7 in the RFID medium manufacturing method according to the preferred embodiment of the present invention.

Referring to FIG. 8, a support table 34 is disposed under the base sheet 1 to support the base sheet 1 during slitting, and the slitting blade 32 is pressed against the spacing part 22 to form a cut part demarcated by a long slit parallel to the long side of the transmitting/receiving antenna 2, and two short slits respectively extending from the opposite ends of the long slit perpendicularly to the long slit toward the assembly of the transmitting/receiving antenna and the IC chip.

Figure 9:
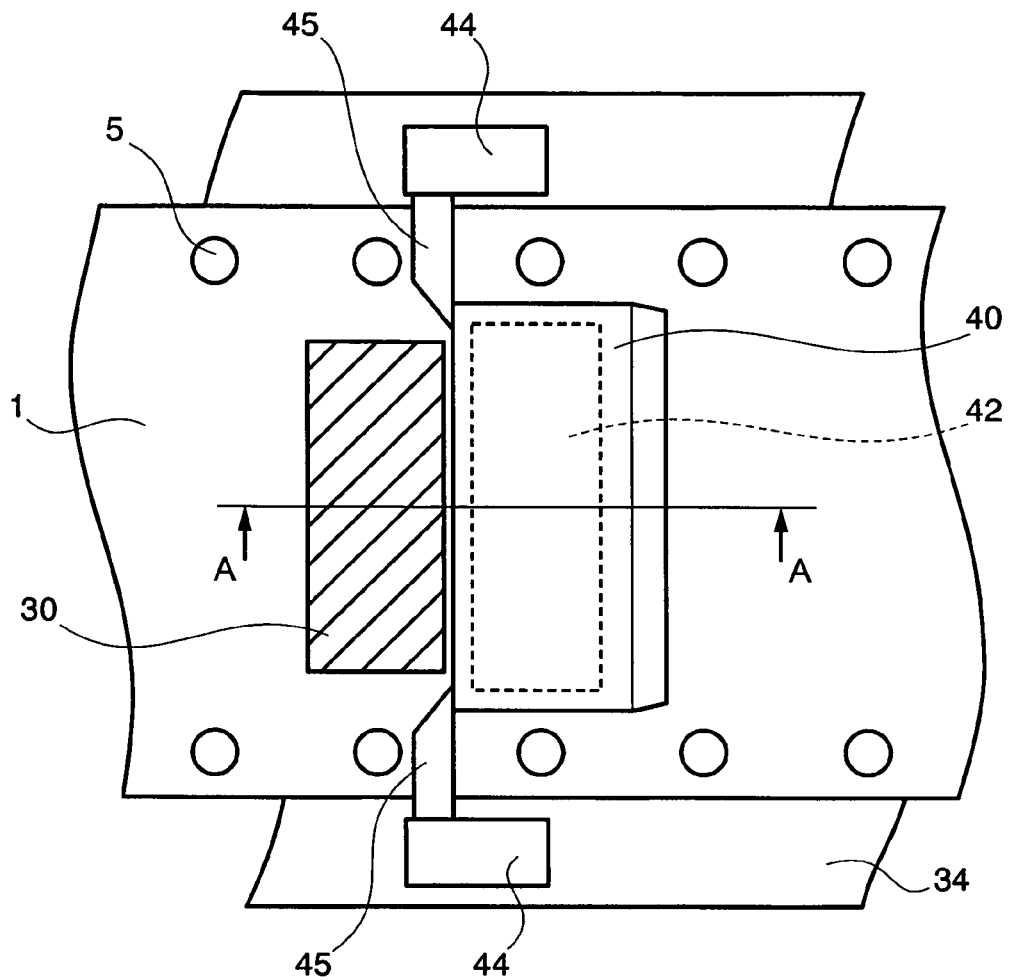
FIG. 9 is a typical plan view showing a cut part folding operation in the RFID medium manufacturing method according to the preferred embodiment of the present invention.

The cut part folding station will be described with reference to FIGS. 9 and 10. FIG. 9 is a typical plan view illustrating a cut part folding operation, and FIG. 10 is a sectional view taken on line A—A in FIG. 9.

Figure 10:
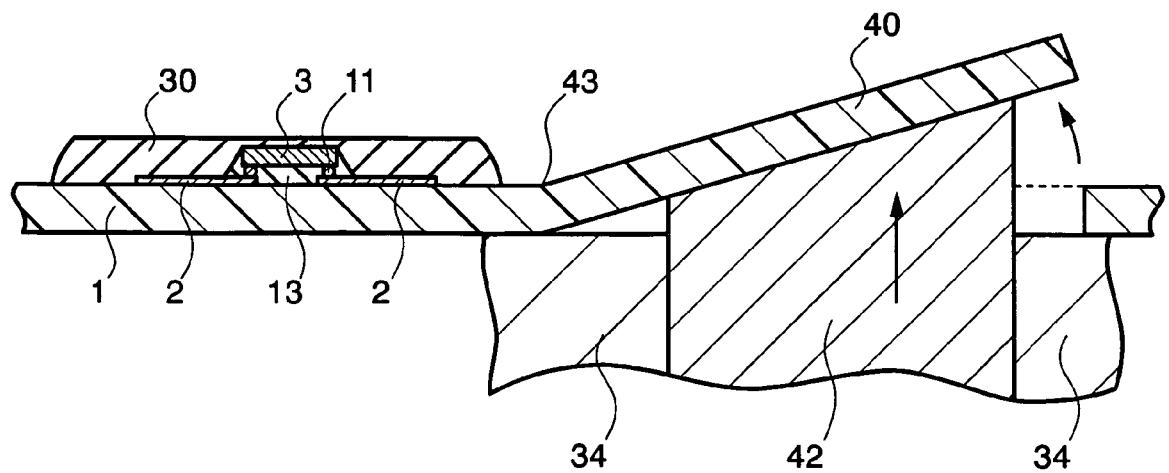
FIG. 10 is a sectional view taken on line A—A in FIG. 9 in the RFID manufacturing method according to the preferred embodiment of the present invention.

Referring to FIGS. 9 and 10, after the three slits have been formed, the cut part 40 is folded toward the IC chip. Fold line positioning members 45, extending inward from fold line positioning devices 44 that are disposed near the opposite longitudinal sides of the base seat 1, determine the position of a fold line 43, and a folding tool 42 placed in the support table 34 is raised to fold the cut part 40 along the fold line 43.

Figure 11:
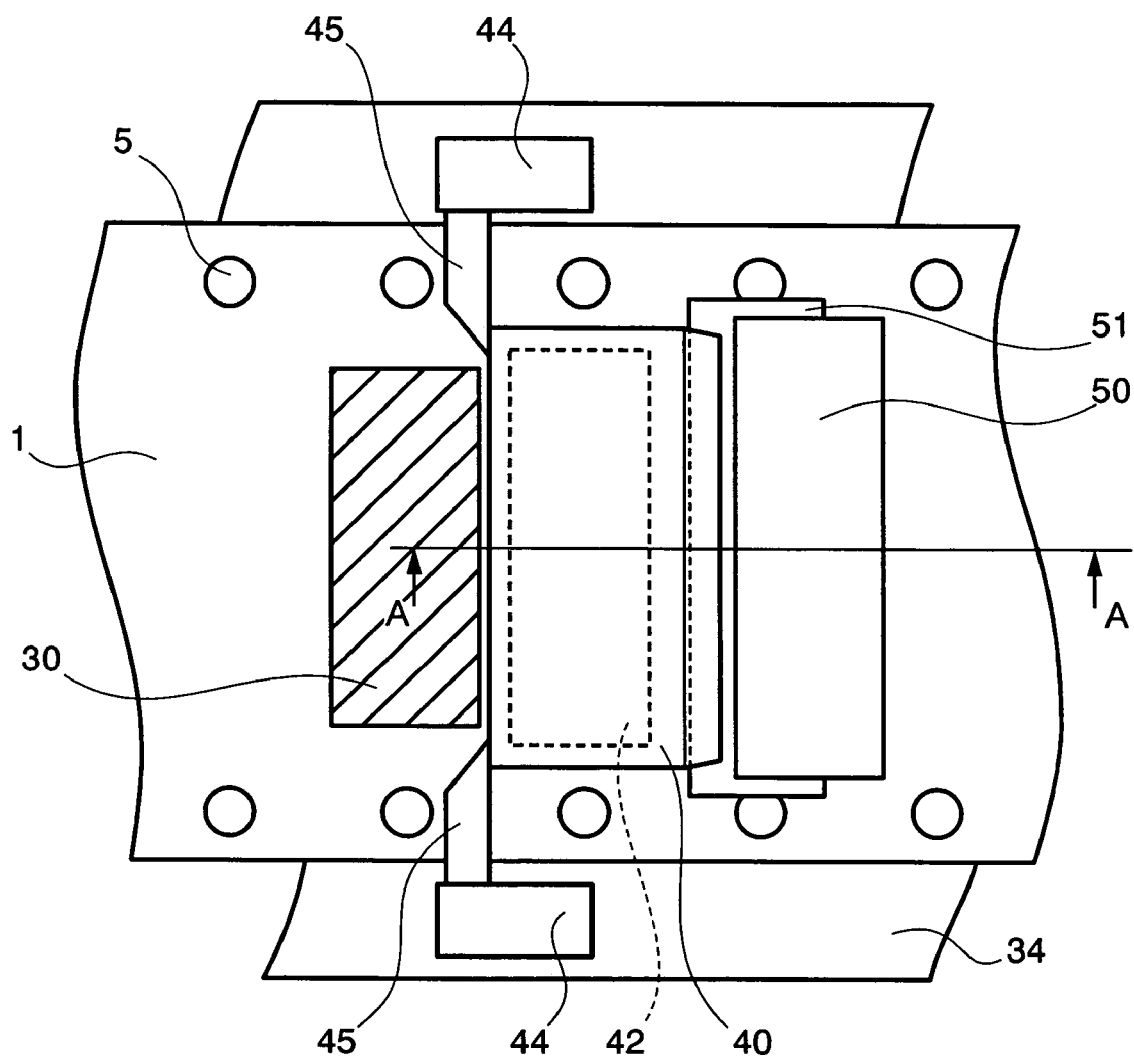
FIG. 11 is a typical plan view showing a folded part pressing operation in the RFID manufacturing method according to the preferred embodiment of the present invention.

The folded part pressing station will be described with reference to FIGS. 11 and 12. FIG. 11 is a typical plan view illustrating a folded part pressing operation, and FIG. 12 is a sectional view taken on line A—A in FIG. 11.

Figure 12:
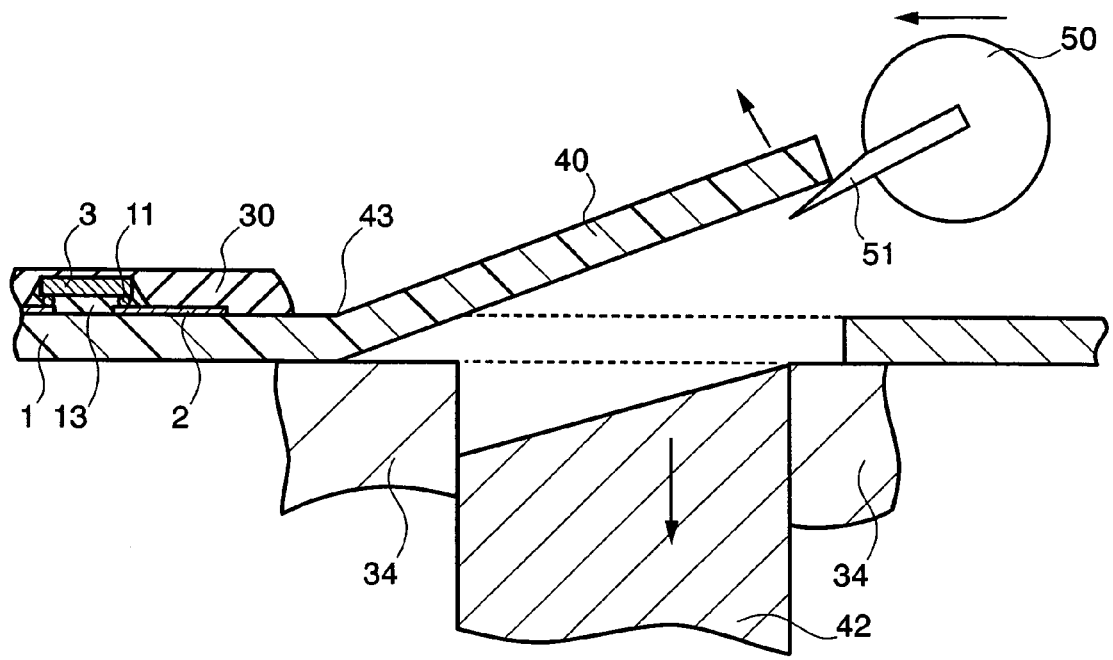
FIG. 12 is a sectional view taken on line A—A in FIG. 11 in the RFID manufacturing method according to the preferred embodiment of the present invention.

Referring to FIGS. 11 and 12, a guide 51 combined with a folding roller 50 is brought into contact with an upper end part of the cut part 40 to support the cut part 40, and then the folding tool 42 is retracted below the base sheet 1. The folding roller 50 and the guide 51 supporting the cut part 40 are then moved transversely as shown in FIGS. 13 and 14.

Operations at the folded part pressing station following those described with reference to FIGS. 11 and 12 will be described with reference to FIGS. 13 and 14. FIG. 13 is a typical sectional view of a workpiece in the course of being folded, and FIG. 14 is a typical plan view of the workpiece after the completion of the folded part pressing operation.

Figure 13:
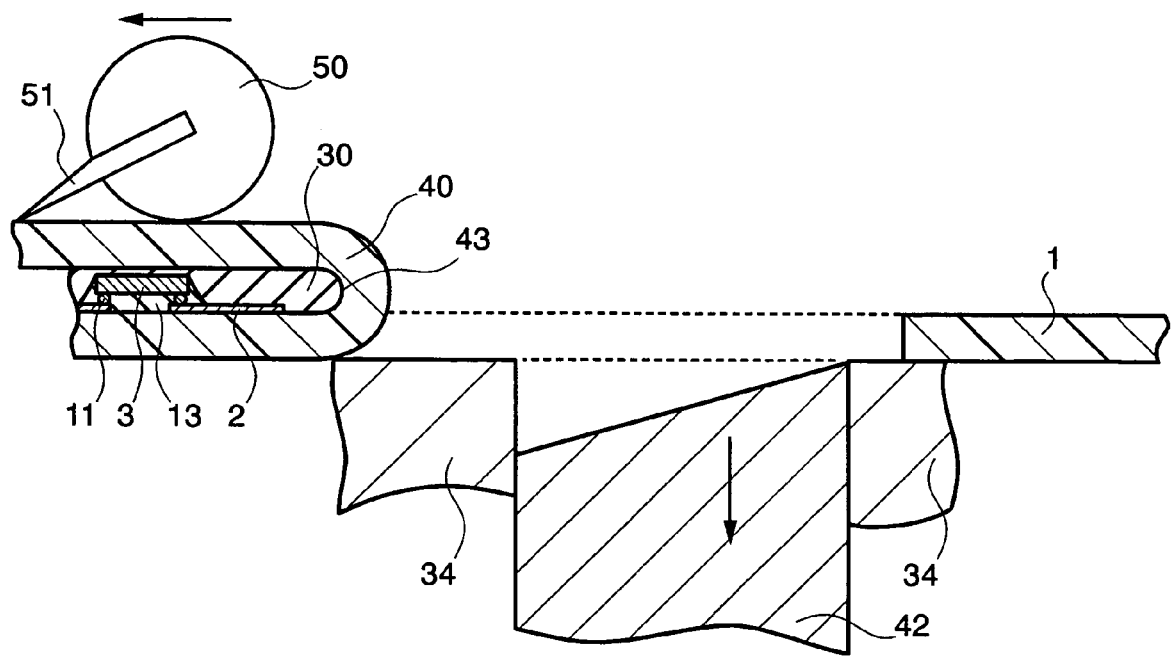
FIG. 13 is a typical sectional view showing a folded part pressing operation included in the RFID medium manufacturing method according to the preferred embodiment of the present invention.
Figure 14:
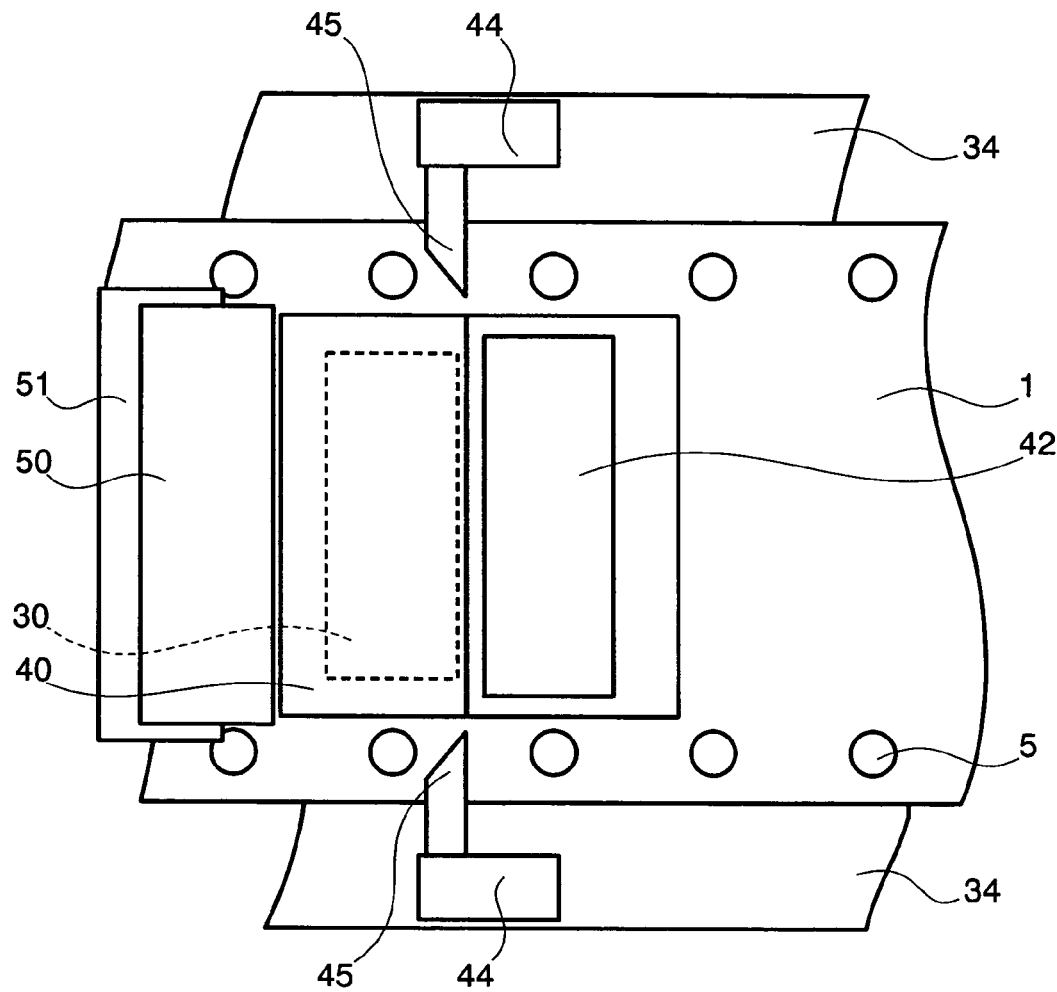
FIG. 14 is a typical plan view showing a state of the completion of the folded part pressing operation in the RFID manufacturing method according to the preferred embodiment of the present invention.

Referring to FIG. 13, the cut part 40 is folded along the fold line, as determined by the fold line positioning devices 44, using the guide 51. As the folded part pressing operation proceeds, the folding roller 50 comes into contact with the surface of the folded part 40 and presses the folded part 40, Referring to FIG. 14, the folded part 40, which is pressed by the folding roller 50, covers the adhesive 30 coating the transmitting/receiving antenna 2. The fold line positioning members 45 of the fold line positioning devices 45 move way from the cut part 40. Then, a take-up roller, not shown, takes up a part, having the RFID medium thus fabricated, of the base sheet 1. RFID mediums thus formed may be rolled in a roll or may be separated into individual RFID mediums (FIG. 1).

A RFID medium which represents a modification of the foregoing RFID medium according to the present invention will be described with reference to FIG. 15, which shows the modified RFID medium in a sectional view.

Figure 15:
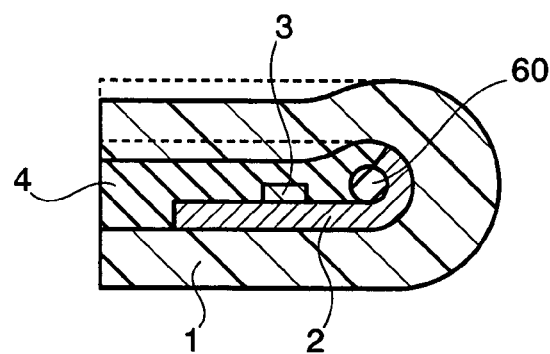
FIG. 15 is a sectional view of a RFID medium in another embodiment according to the present invention.
Figure 16:
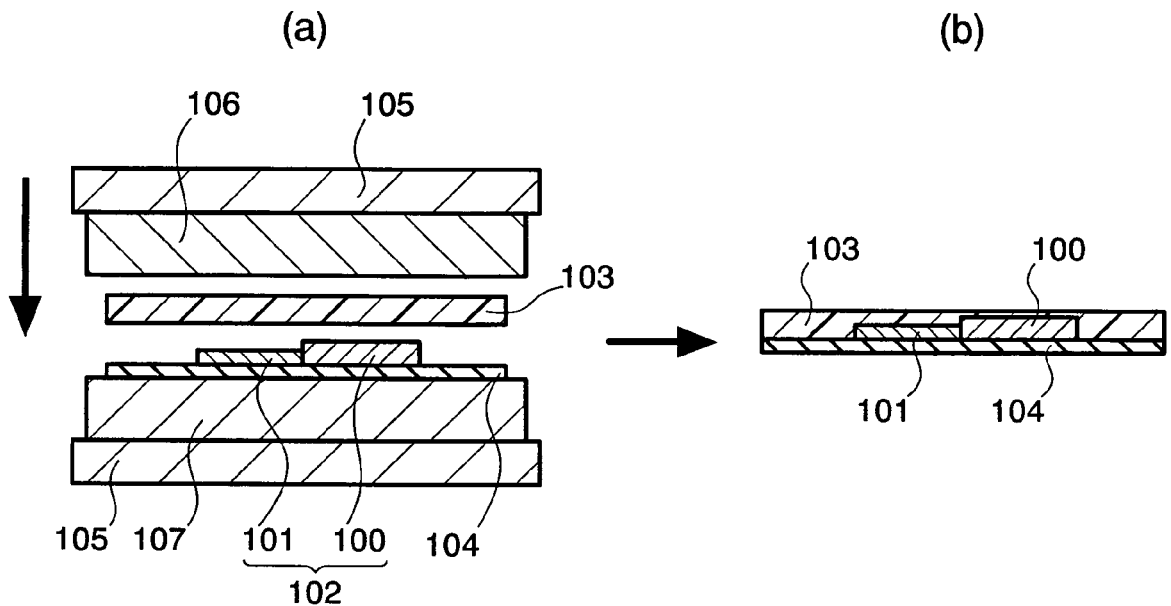
Figure 17:
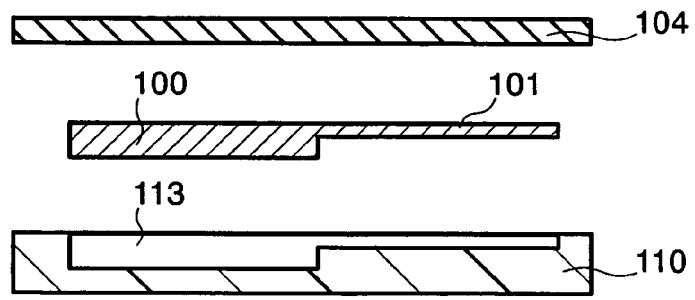
FIG. 17 is a sectional view of the arrangement of component parts to be assembled by a conventional lamination method in a comparative example.
Figure 18:
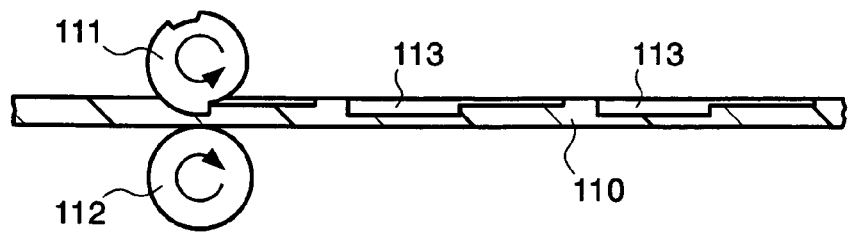
FIG. 18 is a sectional view of illustrating a recess forming process included in the conventional lamination method in a comparative example.
Figure 19:
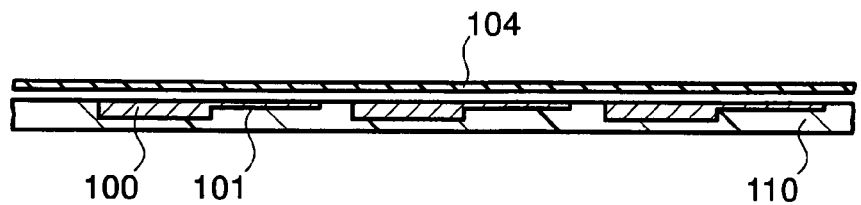
FIG. 19 is a sectional view of an assembly of the base sheet and a cover sheet placed on the base sheet by the conventional lamination method in a comparative example.
Figure 20:
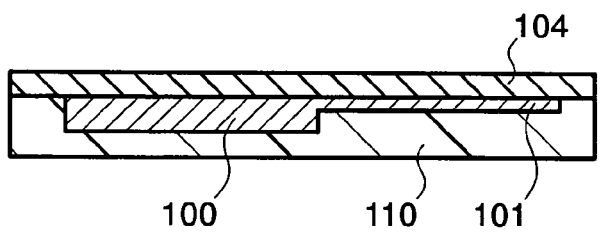
FIG. 20 is a sectional view of a finished, individual product manufactured by the conventional lamination method in a comparative example.
Figure 21:
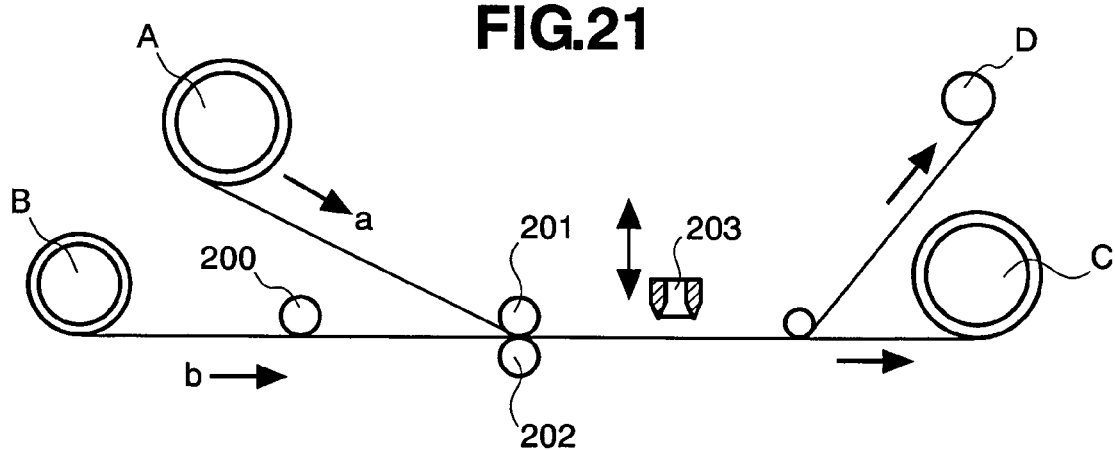
FIG. 21 is a diagrammatic view illustrating a method of manufacture of an IC-inlaid band and an IC tag, using another conventional lamination method.
Figure 22:
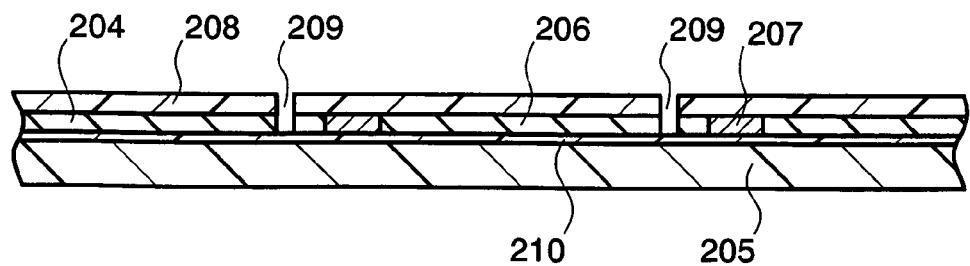
FIG. 22 is a sectional view of separate IC tag bodies formed by the other conventional lamination method in a comparative example.
Figure 23:
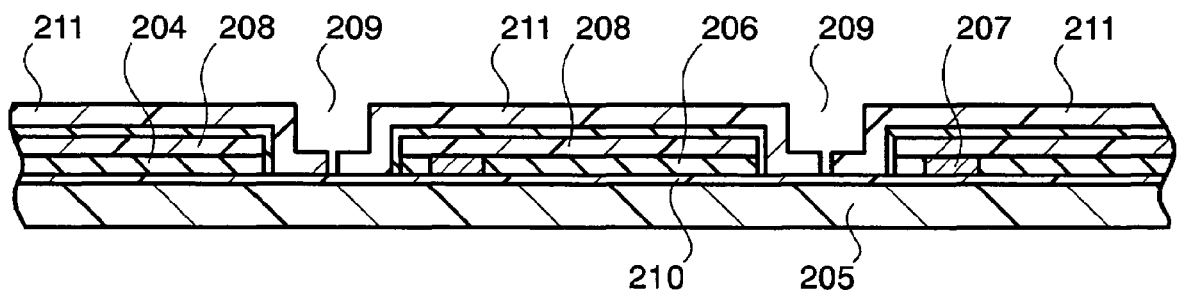
FIG. 23 is a sectional view of IC tags formed by attaching labels to the IC tag bodies by the other conventional lamination method in a comparative example.

FIG. 15 shows a revised configuration which is intended for more miniaturization with respect to that of the RFID medium shown in FIG. 1. In this RFID medium, a folded part of a base sheet 1 covering an IC chip 3 includes part of the base sheet 1 in which part of the transmitting/receiving antenna 2 is formed. When a cut part of the base sheet 1 is folded along a fold line extending in the part of the base sheet 1 in which the part of the transmitting/receiving antenna 2 is formed, a string 60 is extended on the part corresponding to the fold line to prevent direct contact between a parts, on the opposite sides of the fold line, of the transmitting/receiving antenna 2. The cut part is folded along the fold line corresponding to the string 60, and the folded cut part is pressed using a folding roller to form a RFID medium of a predetermined thickness. In FIG. 15, dotted lines indicate the surfaces of the cut part before pressing, and solid lines indicate the same surfaces after pressing.

The string 60 is wound round a reel in a string package to facilitate using the string 60. The reel holding the string package is placed on one side of the base sheet 1, and the string 60 is pulled out from the string package and is extended on the part, corresponding to the fold line extending on a part in which part of the transmitting/receiving antenna 2 is formed, of the base sheet 1. After the folded part has been shaped by the pressing roller, the string 60 is cut to have a length corresponding to the width of the base sheet 1. The string 60 is, for example, a polyimide resin filament capable of withstanding pressure and heat that may be applied thereto during the pressing process. When the string 60 is formed of a polyimide resin, the base sheet 1 is, for example, a polyethylene terephthalate resin film. The string 60 and the base sheet 1 may be formed of any suitable materials other than those mentioned herein.

The IC chip 3 of each of those RFID mediums shown in FIGS. 1 and 15 is covered with the cut part of the base sheet 1 by folding the same cut part. Perforations or a groove may be formed in a part, corresponding to the fold line, of the base sheet 1 to facilitate folding the cut part.

As apparent from the foregoing description, the transmitting/receiving antenna 2 and the IC chip 3 can be covered with the base sheet 1 without laminating any additional member to the base sheet 1, which is effective in reducing the manufacturing cost. The communicating performance of the assembly of the transmitting/receiving antenna 2 and the IC chip 3 supported on the base sheet 1 can be tested because the base sheet 1 has the spacing parts 22 for covering the assemblies each formed of the transmitting/receiving antenna 2 and the IC chip 3, which improves the efficiency of the manufacturing operation.

The invention claimed is:

1. A method of manufacturing a wireless communication medium using a base sheet on a surface of which transmitting/receiving antennas are formed to be arranged in a longitudinal direction of the base sheet with a spacing part between each pair of the transmitting/receiving antennas adjacent each other, by unwinding the base sheet from a first roll in which the base sheet is wound, bonding an IC chip to each of the transmitting/receiving antennas, and then rolling the base sheet in a second roll, comprising:

a first step of mounting and bonding the IC chip to each of the transmitting/receiving antennas formed on the surface of the base sheet so that a plurality of assemblies each having one of the transmitting/receiving antennas and the IC chip bonded to the one of the transmitting/receiving antennas are arranged on the surface of the base sheet in the longitudinal direction of the base sheet;

a second step of filling an underfill material in a gap between the one of the transmitting/receiving antennas and the IC chip bonded to the one of the transmitting/receiving antennas for each of the plurality of assemblies, and then curing the underfill material filled in the gap;

a third step of testing communication performances of the plurality of assemblies and sorting the plurality of assemblies according to their qualities;

a fourth step of forming a cut part in the spacing part adjacent to the IC chip of each of the plurality of assemblies; and a fifth step of covering the one of the transmitting/receiving antennas and the IC chip of the each of the plurality of assemblies corresponding to the cut part entirely with the cut part by folding the cut part, the above steps performed successively between a step of unwinding the base sheet from the first roll and a step of rolling the base sheet in the second roll, wherein the communication performances of the plurality of assemblies are tested individually in the third step, and the cut part formed in the fourth step is demarcated in a rectangular shape by a first slit extending transverse to the longitudinal direction of the base sheet and second and third slits each extended from opposite ends of the first slit toward one of the plurality of assemblies to be covered by the cut part in the spacing part adjacent to the one of the plurality of assemblies.

2. The method of manufacturing a wireless communication medium according to claim 1, wherein the fourth step includes a step for applying an adhesive to the one of the transmitting/receiving antennas and the IC chip bonded to the one of the transmitting/receiving antennas for each of the plurality of assemblies before the cut part is formed in the spacing part adjacent to the IC chip of the each of the plurality of assemblies, and the fifth step includes a step of sealing the transmitting/receiving antenna and the IC chip connected to the transmitting/receiving antenna in the adhesive for each of the plurality of assemblies.

3. The method of manufacturing a wireless communication medium according to claim 1, wherein the fifth step includes a step of pressing the cut part folded on the each of the plurality of assemblies corresponding thereto with a roller.

4. The method of manufacturing a wireless communication medium according to claim 1, wherein the transmitting/receiving antennas are extended transverse to the longitudinal direction of the base sheet, and each pair of the transmitting/receiving antennas adjacent each other are spaced by the spacing part so as to prevent interference of signals therebetween in the third step.

5. The method of manufacturing a wireless communication medium according to claim 1, wherein the first slit is formed longer than the second and third slits and the second and third slits are formed to be extended perpendicularly to the first slit in the fourth step, and the cut part is folded along a fold line at an opposite side of the rectangular shape thereof to the first slit in the fifth step.

6. A method of manufacturing a wireless communication medium using a base sheet on a surface of which transmitting/receiving antennas are formed with a spacing part between each pair of the transmitting/receiving antennas adjacent each other, by unwinding the base sheet from a first roll in which the base sheet is wound, bonding an IC chip to each of the transmitting/receiving antennas, and then rolling the base sheet in a second roll, comprising:

a first step of mounting and bonding the IC chip to each of the transmitting/receiving antennas formed on the surface of the base sheet so that a plurality of assemblies each having one of the transmitting/receiving antennas and the IC chip bonded to the one of the transmitting/receiving antennas are arranged on the surface of the base sheet;

a second step of filling an underfill material in a gap between the one of the transmitting/receiving antennas and the IC chip bonded to the one of the transmitting/receiving antennas for each of the plurality of assemblies, and then curing the underfill material filled in the gap;

a third step of testing the assembly of the transmitting/receiving antenna and the IC chip for communication performance to decide if the assembly is acceptable;

a fourth step of forming a cut part in the spacing part adjacent to the IC chip of each of the plurality of assemblies; and a fifth step of covering the one of the transmitting/receiving antennas and the IC chip of the each of the plurality of assemblies corresponding to the cut part entirely with the cut part by folding the cut part, wherein the communication performances of the plurality of assemblies are tested individually in the third step, and the cut part formed in the fourth step is demarcated in a U-shape by a first slit extending transverse to the longitudinal direction of the base sheet and second and third slits each extended from opposite ends of the first slit toward one of the plurality of assemblies to be covered by the cut part in the spacing part adjacent to the one of the plurality of assemblies.

7. The method of manufacturing a wireless communication medium according to claim 6, wherein the fourth step includes a step for applying an adhesive to the one of the transmitting/receiving antennas and the IC chip bonded to the one of the transmitting/receiving antennas for each of the plurality of assemblies before the cut part is formed in the spacing part adjacent to the IC chip of the each of the plurality of assemblies, and the fifth step includes a step of sealing the transmitting/receiving antenna and the IC chip connected to the transmitting/receiving antenna in the adhesive for each of the plurality of assemblies.

8. The method of manufacturing a wireless communication medium according to claim 6, wherein the fifth step includes a step of pressing the cut part folded on the each of the plurality of assemblies corresponding thereto with a roller.

9. The method of manufacturing a wireless communication medium according to claim 6, wherein each pair of the transmitting/receiving antennas adjacent each other are spaced by the spacing part so as to prevent interference of signals therebetween in the third step.

10. The method of manufacturing a wireless communication medium according to claim 6, wherein the first slit is formed longer than the second and third slits and the second and third slits are formed to be extended perpendicularly to the first slit in the fourth step, and the cut part is folded along a fold line at an open side of the U-shape thereof in the fifth step.

* * * * *